(12) United States Patent
Li

(10) Patent No.: US 6,887,801 B2
(45) Date of Patent: May 3, 2005

(54) EDGE BEAD CONTROL METHOD AND APPARATUS

(75) Inventor: Bernard Q. Li, Plymouth, MN (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/623,351

(22) Filed: Jul. 18, 2003

(65) Prior Publication Data

US 2005/0014390 A1 Jan. 20, 2005

(51) Int. Cl.[7] .................. H01L 21/31; H01L 21/469
(52) U.S. Cl. ............................. 438/780; 438/782
(58) Field of Search ...................... 438/778, 780, 438/782; 427/240

(56) References Cited

U.S. PATENT DOCUMENTS

| | | |
|---|---|---|
| 4,317,085 A | 2/1982 | Brunham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |

(Continued)

FOREIGN PATENT DOCUMENTS

| | | |
|---|---|---|
| DE | 4240706 A1 | 6/1994 |
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Banwell et al., "VCSE Laser Transmitters for Parallel Data Links", *IEEE Journal of Quantum Electronics,* vol. 29, No. 2, Feb. 1993, pp. 635–644.

Bowers et al., "Fused Vertical Cavity Lasers With Oxide Aperture", Final report for MICRO project 96–042, Industrial Sponsor: Hewlett Packard, 4 pages, 1996–97.

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors,* Academic Press, Inc., Copyright 1988, pp. 83–120.

Choe, et al., "Lateral oxidation of AIAs layers at elevated water vapour pressure using a closed–chamber system," Letter to the Editor, Semiconductor Science Technology, 15, pp. L35–L38, Aug. 2000.

Choa et al., "High–Speed Modulation of Vertical–Cavity Surface–Emitting Lasers", *IEEE Photonics Technology Letter,* vol. 3, No. 8, Aug. 1991, pp. 697–699.

Choquette et al., "High Single Mode Operation from Hybrid Ion Implanted/Selectively Oxidized VCSELs", 200 IEEE 17th International Semiconductor Laser Conference, Monterrey, CA pp. 59–60.

(Continued)

*Primary Examiner*—Alexander Ghyka
(74) *Attorney, Agent, or Firm*—Workman Nydegger

(57) ABSTRACT

Methods and devices for handling wafers during wafer processing are provided. One embodiment includes an apparatus for holding a wafer. The holding apparatus includes a pocket for receiving a wafer, and may include a mechanism allowing for the wafer to be secured within the pocket. Methods are also included for preparing a wafer for fabrication processes by the use of a wafer holding apparatus. These methods may include applying a layer of photoresist to the surface of a wafer.

17 Claims, 3 Drawing Sheets

U.S. PATENT DOCUMENTS

| | | |
|---|---|---|
| 5,031,187 A | 7/1991 | Orenstein et al. |
| 5,052,016 A | 9/1991 | Mahbobzadeh |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt et al. |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodzinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Kem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,908,661 A * | 6/1999 | Batcheldor et al. ......... 427/240 |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 7/2000 | Selli et al. |
| 6,133,590 A | 10/2000 | Ashley et al. |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thornton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B2 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B2 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,371 B1 | 12/2002 | Boucart et al. |
| 6,493,372 B1 | 12/2002 | Boucart et al. |
| 6,493,373 B1 | 12/2002 | Boucart et al. |
| 6,496,621 B1 | 12/2002 | Kathman et al. |

| | | |
|---|---|---|
| 6,498,358 B1 | 12/2002 | Lach et al. |
| 6,501,973 B1 | 12/2002 | Foley et al. |
| 6,515,308 B1 | 2/2003 | Kneissl et al. |
| 6,535,541 B1 | 3/2003 | Boucart et al. |
| 6,542,531 B2 | 4/2003 | Sirbu et al. |
| 6,567,435 B1 | 5/2003 | Scott et al. |
| 2001/0004414 A1 | 6/2001 | Kuhn et al. |
| 2003/0072526 A1 | 4/2003 | Kathman et al. |

OTHER PUBLICATIONS

Choquette et al., "Lithographically–Defined Gain Apertures Within Selectively Oxidized VCSELs", paper CtuL6, Conference on Lasers and Electro–Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low–Threshold 1.57– $\mu$m VC–SEL's Using Strain–Compensated Quantum Wells and Oxide/Metal Backmirror," IEEE Photonics Technology Letters, vol. 7, No. 5, pp. 444–446, May 1995.

Chua, et al., "Planar Laterally Oxidized Vertical–Cavity Lasers for Low–Threshold High–Density Top–Surface–Emitting Arrays," IEEE Photonics Technology Letters, vol. 9, No. 8, pp. 1060–1062, Aug. 1997.

Cox, J. A., et al., "Guided Mode Grating Resonant Filters for VCSEL Applications", Proceedings of the SPIE, The International Society for Optical Engineering, Diffractive and Holographic Device Technologies and Applications V, San Jose, California, Jan. 28–29, 1998, vol. 3291, pp. 70–71.

Farrier, Robert G., "Parametric control for wafer fabrication: New CIM techniques for data analysis," Solid State Technology, pp. 99–105, Sep. 1997.

Fushimi, et al., "Degradation Mechanism in Carbon–doped GaAs Minority–carrier Injection Devices," 34th Annual IRPS Proceedings, Dallas, TX., Apr. 29–May 2, 1996, 8 pages.

G. G. Ortiz, et al., "Monolithic Integration of In0.2 GA0.8As Vertical Cavity Surface–Emitting Lasers with Resonance–Enhanced Quantum Well Photodetectors", Electronics Letters, vol. 32, No. 13, Jun. 20, 1996, pp. 1205–1207.

G. Shtengel et al., "High–Speed Vertical–Cavity Surface–Emitting Lasers", Photon. Techn. Lett., vol. 5, No. 12, pp. 1359–1361 (Dec. 1993).

Geib, et al., "Comparison of Fabrication Approaches for Selectively Oxidized VCSEL Arrays," Proceedings of SPIE, vol. 3946, pp. 36–40, 2000.

Graf, Rudolph, Modern Dictionary of Electronics, 6th ed., Indiana: Howard W. Sams & Company, 1984, p. 694.

Guenter et al., "Reliability of Proton–Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL Technology: further developments," Proceedings of the SPIE, vol. 4286, GSPIE 2000, 14 pages.

Hadley et al., "High–Power Single Mode Operation from Hybrid Ion Implanted/Selectively Oxidized VCSELs", 13th Annual Meeting IEEE Lasers and Electro–Optics Society 2000 Annual Meeting (LEOS 2000), Rio Grande, Puerto Rico, pp. 804–805.

Hawthorne, et al., "Reliability Study of 850 nm VCSELs for Data Communications," IEEE, pp. 1–11, May 1996.

Herrick, et al., "Highly reliable oxide VCSELs manufactured at HP/Agilent Technologies," Invited Paper, Proceedings of SPIE vol. 3946, pp. 14–19, 2000.

Hibbs–Brenner et al., "Performance, Uniformity and Yield of 850nm VCSELs Deposited by MOVPE", IEEE Phot. Tech. Lett., vol. 8, No. 1, pp. 7–9, Jan. 1996.

Hideaki Saito, et al., "Controlling polarization of quantum–dot surface–emitting lasers by using structurally anisotropic self–assembled quantum dots," American Institute of Physics, Appl, Phys. Lett. 71 (5), pp. 590–592, Aug. 4, 1997.

Hornak et al., "Low–Termperature (10–K–300K) Characterization of MOVPE–Grown Vertical–Cavity Surface–Emitting Lasers", Photon. Tech. Lett., vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", Appl. Phys. Lett., vol. 66, No. 14, pp. 1723–1725, Apr. 3, 1995.

Jewell et al., "Surface Emitting Microlasers for Photonic Switching & Intership Connections", Optical Engineering, vol. 29, No. 3, pp. 210–214, Mar. 1990.

Jiang et al., "High–Frequency Polarization Self–Modulation in Vertical–Cavity Surface–Emitting Lasers", Appl. Phys. Letters, vol. 63, No. 26, Dec. 27, 1993, pp. 2545–2547.

K.L. Lear et al., "Selectively Oxidized Vertical Cavity Surface–Emitting Lasers with 50% Power Conversion Efficiency", Elec. Lett., vol. 31, No. 3 pp. 208–209, Feb. 2, 1995.

Kash, et al., "Recombination in GaAs at the AlAs oxide–GaAs interface," Applied Physics Letters, vol. 67, No. 14, pp. 2022–2024, Oct. 2, 1995.

Kishino et al., "Resonant Cavity–Enhanced (RCE) Photodetectors", IEEE Journal of Quantum Electronics, vol. 27, No. 8, pp. 2025–2034.

Koley B., et al., "Dependence of lateral oxidation rate on thickness of AlAs layer of interest as a current aperture in vertical–cavity surface–emitting laser structures", Journal of Applied Physics, vol. 84, No. 1, pp. 600–605, Jul. 1, 1998.

Kuchibhotla et al.; "Low–Voltage High Gain Resonant_ Cavity Avalanche Photodiode", IEEE Photonics Technology Letters, vol. 3, No. 4, pp. 354–356.

Lai et al., "Design of a Tunable GaAs/AlGaAs Multiple–Quantum–Well Resonant Cavity Photodetector", IEEE Journal of Quantum Electronics, vol. 30, No. 1, pp. 108–114.

Lee et al., "Top–Surface Emitting GaAs Four–Quantum–Well Lasers Emitting at 0–85 um", Electronics Letters, vol. 24, No. 11, May 24, 1990, pp. 710–711.

Lehman et al., "High Frequency Modulation Characteristics of Hybrid Dielectric/AlGaAs Mirror Singlemode VCSELs", Electronic Letters, vol. 31, No. 15, Jul. 20, 1995, pp. 1251–1252.

Maeda, et al., "Enhanced Glide of Dislocations in GaAs Single Crystals by Electron Beam Irradiation," Japanese Journal of Applied Physics, vol. 20, No. 3, pp. L165–L168, Mar. 1981.

Magnusson, "Integration of Guided–Mode Resonance Filters and VCSELs", Electo–Optics Research Center, Department of Electrical Engineering, University of Texas at Arlington, May 6, 1997.

Martinsson et al., "Transverse Mode Selection in Large–Area Oxide–Confined Vertical–Cavity Surface–Emitting Lasers Using a Shallow Surface Relief", IEEE Photon. Technol. Lett., 11(12), 1536–1538 (1999).

Miller et al., "Optical Bistability Due to Increasing Absorption", Optics Letters, vol. 9, No. 5, May 1984, pp. 162–164.

Min Soo Park and Byung Tae Ahn, "Polarization control of vertical–cavity surface–emitting lasers by electro–optic birefringence," Applied Physics Letter, vol. 76, No. 7, pp. 813–815, Feb. 14, 2000.

Morgan et al., "200 C, 96–nm Wavelength Range, Continuous–Wave Lasing from Unbonded GaAs MOVPE–Grown Vertical Cavity Surface–Emitting Lasers", IEEE Photonics Technology Letters, vol. 7, No. 5, May 1995, pp. 441–443.

Morgan et al., "High–Power Coherently Coupled 8x8 Vertical Cavity Surface Emitting Laser Array", Appl. Phys Letters, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", Appl. Phys. Letters, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "One Watt Vertical Cavity Surface Emitting Laser", Electron. Lett., vol. 29, No. 2, pp. 206–207, Jan. 21, 1993.

Morgan et al., "Producible GaAs–based MOVPE–Grown Vertical–Cavity Top–Surface Emitting Lasers with Record Performance", Elec. Lett., vol. 31, No. 6, pp. 462–464, Mar. 16, 1995.

Morgan et al., "Progress and Properties of High–Power Coherent Vertical Cavity Surface Emitting Laser Arrays", SPIE, Vo. 1850, Jan. 1993, pp. 100–108.

Morgan et al., "Progress in Planarized Vertical Cavity Surface Emitting Laser Devices and Arrays", SPIE, vol. 1562, Jul. 1991, pp. 149–159.

Morgan et al., "Spatial–Filtered Vertical–Cavity Top Surface–Emitting Lasers", CLEO, 1993, pp. 138–139.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", IEEE Photonics Technology Letters, vol. 4, No. 4, Apr. 1993, pp. 374–377.

Morgan et al., "Vertical–cavity surface–emitting laser arrays", Invited Papers, SPIE, vol. 2398, Feb. 6, 1995, pp. 65–93.

Morgan et al., Vertical–cavity surface emitting lasers come of age, Invited paper, SPIE, vol. 2683, 0–8194–2057, Mar. 1996, pp. 18–29.

Morgan, "High–Performance, Producible Vertical Cavity Lasers for Optical Interconnects", High Speed Electronics and Systems, vol. 5, No. 4, Dec. 1994, pp. 65–95.

Naone R.L., et al., "Tapered–apertures for high–efficiency miniature VCSELs", LEOS newsletter, vol. 13, No. 4, pp. 1–5, Aug. 1999.

Nugent et al., "Self–Pulsations in Vertical–Cavity Surface–Emitting Lasers", Electronic Letters, vol. 31, No. 1, Jan. 5, 1995, pp. 43–44.

Oh, T. H. et al., "Single–Mode Operation in Antiguided Vertical–Cavity Surface–Emitting Laser Using a Low–Temperature Grown AlGaAs Dielectric Aperture", IEEE Photon. Technol. Lett. 10(8), 1064–1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687–689, Jul. 2001.

Peck, D. Stewart, Comprehensive Model for Humidity Testing Correlation, IEEE/IRPS, pp. 44–50, 1986.

Ries, et al., "Visible–Spectrum ($\lambda$=650nm) photopumped (pulsed, 300 K) laser operation of a vertical–cavity AlAs–AlGaAs/InAlP–InGaP quantum well heterostructure utilizing native oxide mirrors," Applied Physics Letters, vol. 67, No. 8, pp. 1107–1109, Aug. 21, 1995.

S.S. Wang and R. Magnusson, "Multilayer Waveguide–Grating Filters", Appl. Opt., vol. 34, No. 14, pp. 2414–2420, 1995.

S.S. Wang and R. Magnusson, "Theory and Applications of Guided–Mode Resonance Filters", Appl. Opt., vol. 32, No. 14, pp. 2606–2613, 1993.

Sah, et al., "Carrier Generation and Recombination in P–N Junctions and P–N Junction Characteristics," Proceedings of the IRE, pp. 1228–1243, Sep., 1957.

Schubert, "Resonant Cavity Light–Emitting diode", Appl. Phys. Lett., vol. 60, No. 8, pp. 921–923, Feb. 24, 1992.

Shi, et al., "Photoluminescence study of hydrogenated aluminum oxide–semiconductor interface," Applied Physics Letters, vol. 70, No. 10, pp. 1293–1295, Mar. 10, 1997.

Smith R.E. et al., Polarization–Sensitive Subwavelength Antireflection Surfaces on a Semiconductor for 975 NM, Optics Letters, vol. 21, No. 15, Aug. 1, 1996, pp. 1201–1203.

Spicer, et al., "The Unified Model For Schottky Barrier Formation and MOS Interface States in 3–5 Compounds," Applications of Surface Science, vol. 9, pp. 83–01, 1981.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

T. Mukaihara, "Polarization Control of Vertical–cavity Surface–Emitting Lasers by a Birefringent Metal/Semiconductor Polarizer Terminating a Distributed Bragg Reflector," Tokyo Institute of Technology, Precision and Intelligence Laboratory, pp. 183–184.

Tao, Andrea, "Wet–Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface–Emitting Lasers," Japan J. Appl. Phys. vol. 33 (1994) pp. L227–L229, Part 2, No. 2B, Feb. 15, 1994.

Tu, Li–Wei et al., "Transparent conductive metal–oxide contacts in vertical–injection top–emitting quantum well lasers", Appl. Phys. Lett. 58(8) Feb. 25, 1991, pp. 790–792.

Weider, H.H., "Fermi level and surface barrier of $Ga_xIn_{l-x}As$ alloys," Applied Physics Letters, vol. 38, No. 3, pp. 170–171, Feb. 1, 1981.

Wipiejewski, et al., "VCSELs for datacom applications," Invited Paper, Part of the SPIE Conference on Vertical–Cavity Surface–Emitting Lasers III, San Jose, California, SPIE vol. 3627, pp. 14–22, Jan. 1999.

Y. M. Yang et al., "Ultralow Threshold Current Vertical Cavity Surface Emitting Lasers Obtained with Selective Oxidation", Elect. Lett. , vol. 31, No. 11, pp. 886–888, May 25, 1995.

Yablonovitch et al., "Photonic Bandgap Structures", *J. Opt. Soc. Am. B.,* vol. 10, No. 2, pp. 283–295, Feb. 1993.

Young et al., "Enhanced Performance of Offset–Gain High Barrier Vertical–Cavity Surface–Emitting Lasers", *IEEE J. Quantum Electron.,* vol. 29, No. 6, pp. 2013–2022, Jun. 1993.

U.S. Appl. No. 09/751,422, filed Dec. 29, 2000, entitled "Resonant Reflector for use with Optoelectronic Devices".

U.S. Appl. No. 09/751,423, filed Dec. 29, 2000, entitled "Spatially, Modulated Reflector for an Optoelectronic Device".

U.S. Appl. No. 2002/0154675 A1, entitled "Reliability–Enhancing Layers for Vertical Cavity Surface Emitting Lasers", Publication date Oct. 24, 2002.

U.S. Appl. No. 2001/0004414 A1, entitled, "Coupling Configuration," Publication date Jun. 21, 2001.

* cited by examiner

EDGE BEAD CONTROL METHOD AND APPARATUS

FIELD OF THE INVENTION

The present invention is related to the field of microfabrication. In particular, the present invention is related to methods for using and handling wafers.

BACKGROUND

Several microfabrication processes call for the use of very thick layers of photoresist. Typically, photoresist layers are applied to wafers by a spinning process. An amount of photoresist is applied in liquid form to a wafer, and the wafer is spun at a predetermined speed for some period of time to spread the photoresist across the wafer surface. A common problem for thick layers is the formation of an edge bead, which is a marked increase in thickness near the outer edge of the wafer. Significant variation in the photoresist thickness creates problems in exposure and development of photoresist during lithography as well as variations in finished die characteristics across a given wafer. In particular, when using a contact mask, a large edge bead can prevent direct contact across a significant area of the wafer, reducing resolution in lithography.

FIG. 1 shows a graphical representation of the edge thickness for three inch and four inch wafers on which a very thick layer has been spun in a prior art process. The dashed lines indicate illustrative upper and lower acceptable bounds for the photoresist layers. The acceptable bounds may vary widely from one process to another. The useful area 10 for the four inch wafer has a diameter of about 2.375 inches, while the useful area 12 for the three inch wafer has a diameter of about 1.5 inches. Approximating the useful areas 10, 20 as circular, the percentage of the four inch wafer area that is useful area 10 is about 35%, while the percentage of the three inch wafer area that is useful area 20 is about 25%. A further problem is that a limiting factor on edge bead size is the centrifugal force on the photoresist during spinning; for small wafers, the centrifugal forces generated are reduced by reduced radius of the wafer edge versus a larger wafer. These low percentages reduce chip yield from each individual wafer, increasing production costs by any of several measures, including wasted goods, environmental harm, and extra time in terms of machine usage and personnel hours.

In several processes, including, for example, a number of vertical cavity surface emitting laser (VCSEL) fabrication processes, thinned wafers are used. For example, rather than using a typical 500 micron thick wafer, some processes use wafers that are about 300 microns thick. These thinned wafers tend to be fragile. Further, some specialized processes, including VCSEL fabrication, make use of special wafers that are relatively small in comparison to the large wafers that many new microfabrication process machines are made to process. While many Si wafer processes for integrated circuitry now use or are configured to use eight inch or larger wafers, specialty processes such as some research and development as well as VSCEL fabrication processes make use of three, four or six inch wafers.

SUMMARY

The present invention, in an illustrative embodiment, includes an apparatus which aids in reducing the incidence and effects of an edge bead on the profile of a thick photoresist layer. A first illustrative embodiment includes a wafer holder designed to hold a wafer while photoresist spinning or other wafer processing steps are performed. The wafer holder may have a pocket shaped and designed to receive a wafer of a particular size. In a further embodiment, the wafer holder may be shaped such that it may be received by wafer processing apparatuses and treated as if the combination wafer holder and wafer of a first size is a wafer of a different size from the first size. In yet another embodiment, the wafer may include an outer groove which aids in containing the spread of photoresist and in releasing a wafer from the holder.

Another illustrative embodiment includes a method of preparing a wafer for a processing step. The method may include providing a wafer holder adapted to receive the wafer. The method may further include placing the wafer in the holder, and then performing a process step such as, for example, spinning photoresist onto the wafer or other lithography and/or epitaxy or material deposition steps, etching steps, grinding, or the like. The method may also include securing the wafer in the holder by use of a mechanical device or by the application of a suction or vacuum force.

Yet another illustrative embodiment includes a method for reducing edge bead thickness during spinning of a photoresist layer. The method may include providing a wafer holder adapted to receive a wafer and bold the wafer during a photoresist spinning step. The method may also include configuring the wafer holder to receive a wafer of a first size and sizing the wafer holder to resemble a wafer of a second size that is larger than the first size.

DETAILED DESCRIPTION OF SEVERAL EMBODIMENTS

The following detailed description should be read with reference to the drawings. The drawings, which are not necessarily to scale, depict illustrative embodiments and are not intended to limit the scope of the invention.

Figure 2:
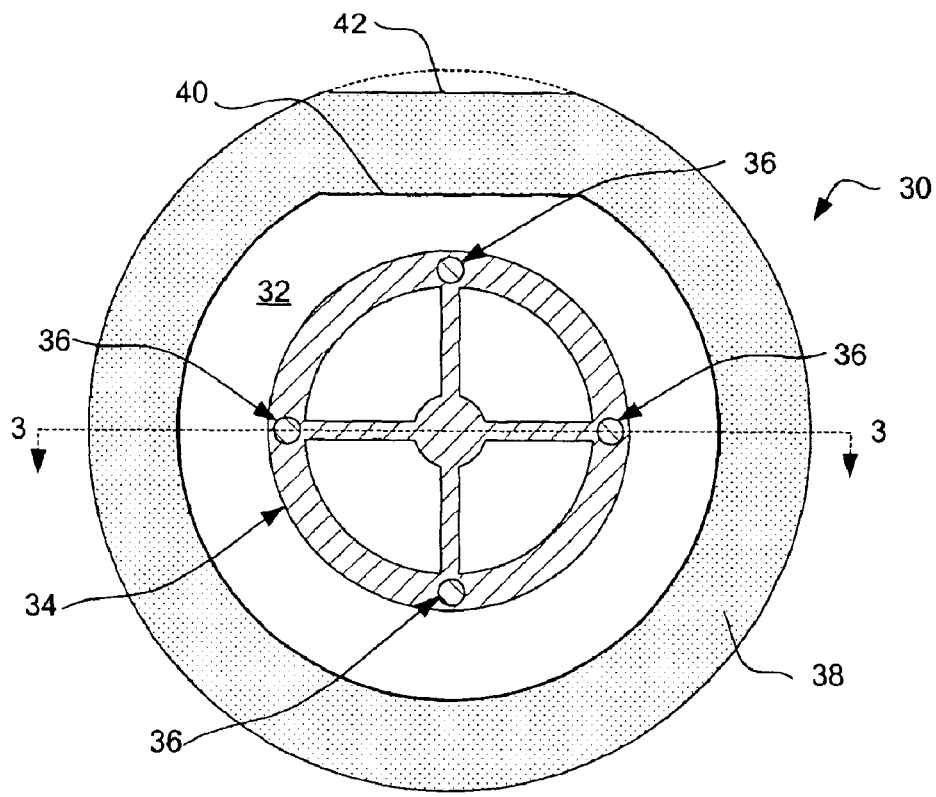
FIG. 2 is an elevation view of a wafer holding apparatus in accordance with an illustrative embodiment of the present invention.

FIG. 2 is an elevation view of a wafer holding apparatus in accordance with an illustrative embodiment of the present invention. The wafer holder 30 includes a recessed area or pocket 32. The pocket 32 includes a channel 34 which is fluidly connected to a number of vacuum holes 36. A raised outer portion 38 defines the pocket 32. In use, a wafer is placed into the pocket 32 and a vacuum force may be applied using the channel 34 and vacuum holes 36. The use of a channel 34 and vacuum holes 36 is merely illustrative of one of many ways a vacuum force may be used to secure a wafer into the pocket 32. The vacuum force/suction may include simply using a pressure which is reduced relative to the surrounding atmosphere and need not mean the application of some certain level of vacuum pressure. Additional channels may also be provided in various locations such as, for example, that illustrated in the working embodiment below.

In other embodiments, other wafer securing apparatuses or features may be used to replace the channel 34 and vacuum holes 36. For example, clips may be provided around the outside of the pocket 32. A wafer may have a hole or holes drilled in, and a screw used to hold the wafer into the pocket 32. Pressure may be provided from the periphery of the pocket 32, for example, with a set screw extending through the raised outer portion 38. A tab or tabs may be provided along the periphery of the pocket 32 such that the wafer may be inserted with the primary or secondary flat aligned to pass by the tabs. The wafer can then be rotated, and pressure may be applied to at least one flat, allowing the tabs to hold the wafer while the flats assure a desired crystalline alignment.

For the illustrative embodiment, a receiving primary flat 40 is provided to define a part of the border of the pocket 32. An outer primary flat 42 is defined on an edge of the wafer holder 30 so the outer primary flat 42 aligns with the receiving primary flat 40. A wafer received in the pocket 32 can be treated by processing apparatuses designed for a larger wafer in a way that accounts for the crystalline orientation of the wafer.

While the wafer holding apparatus 30 of FIG. 2 is illustrated having only a primary flat plane (corresponding to the structure of many types of wafers including, for example, a P-type (111) Si wafer), a secondary flat may be provided as needed for any wafer design. For example, using Si terminology to keep discussion simple and short, a wafer holding apparatus having a secondary flat at an angle of 45 degrees to the primary flat could be used for an n-type (111) wafer, an angle of 90 degrees for a p-type (100) wafer, or an angle of 135 degrees for an n-type (100) wafer. If desired, the flat may be omitted, for example, for additive or surface processes or where specific alignment of the crystalline orientation of the underlying wafer is not needed.

Figure 3:
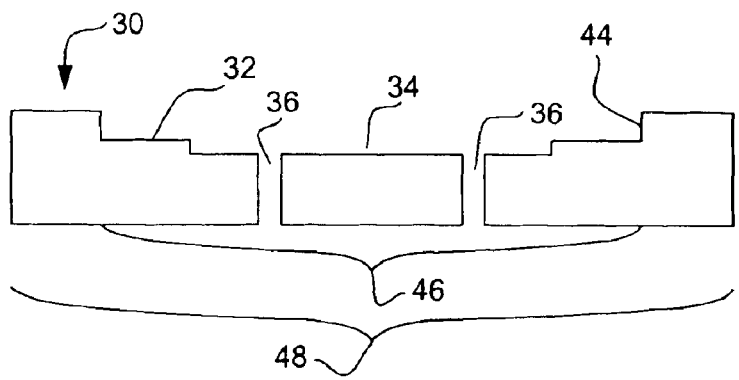
FIG. 3 is a cross sectional view taken along line 3—3 of FIG. 2.

FIG. 3 is a cross sectional view taken along line 3—3 of FIG. 2. As illustrated in FIG. 3, the pocket 32 includes a channel 34 as well as through holes 36. The pocket 32 has a height 44. The height 44 may be of any desired size. In one illustrative embodiment, the height 44 is chosen to be equal to the thickness of a wafer that is to be held in the pocket 32. The height 44 may also be chosen to be greater or less than the wafer thickness. In another example, the height 44 is equal to the thickness of a wafer plus some fraction of the desired thickness of a photoresist layer to be deposited on the wafer.

The pocket 32 also has a width 46 which may correspond to the size of a wafer to be received by the pocket 32. The holder 30 may have an overall width 48 that is chosen to correspond to a known wafer size, although any appropriate size may be selected. In one example, the pocket 32 has a width 46 corresponding to a 3-inch wafer, and the holder 30 has a width 48 corresponding to the size of a 4-inch wafer. Other combinations may of course be used with 3, 4, 6, 8 or 12 inch wafers, for example, or any other size.

The holder 30 may be made of any material including a variety of metals, plastics, ceramics, glass, or crystalline materials. Some illustrative considerations in choosing the material for the holder may include the compatibility of the material with selected processes to be performed on a wafer held in the holder 30, cost of the material, or ability to form the material within desired tolerances. Some example compatibility considerations may include durability or strength, density/weight, melting or plastic deformation temperatures, adherence to photoresist, electrically insulative properties, or resistance to etching chemicals. In the working embodiment explained below, the illustrative holder was constructed of aluminum.

In several embodiments, the wafer holder 30 is used with devices that apply a suction through channels on a surface. For example, many conventional spinning apparatuses include channels and/or through holes which apply suction to wafers placed on a rotatable surface. The through holes 36 may be placed, at least on the bottom of the holder 30, to correspond to a design of channels and/or holes on the rotatable surface of a spinning apparatus. The lower portion of the wafer holder 30 may also include channels or other designs that facilitate passage of vacuum force to the through holes 36. Often, once photoresist is applied on the wafer, the wafer will be held in place in part by the typically sticky photoresist after spinning is completed, and so when the vacuum force is removed the wafer stays in place.

In other uses, vacuum pressure may be applied to hold a wafer in place and the through holes 36 and/or the channel 34 may be plugged to maintain suction. The step of plugging the through holes 36 may be performed in a vacuum environment by dipping a portion of the back side of the holder into a semi-liquid material, or by placing a cap or other device over the back of the holder. A thin plastic adhesive layer (i.e. a specially designed tape) may also be applied.

By securing a wafer in a holder such as holder 30, the present invention may provide added safety in wafer processing. For example, many wafers are quite fragile and the use of a holder may improve durability during processing. Also, given the caustic chemicals often in use, a person working in a lab is often required to wear gloves, making the handling of a wafer difficult. The added bulk of the holder 30 makes handling easier. Further, in particular with thinned wafers, the wafers themselves tend to be brittle and the use of a holder may prevent accidental breakage during handling. In some embodiments, the use of suction applied to the back side of a wafer may also improve surface properties, in particular, reducing curvature caused by differences in the coefficient of thermal expansion of layers of a wafer.

Figure 4:
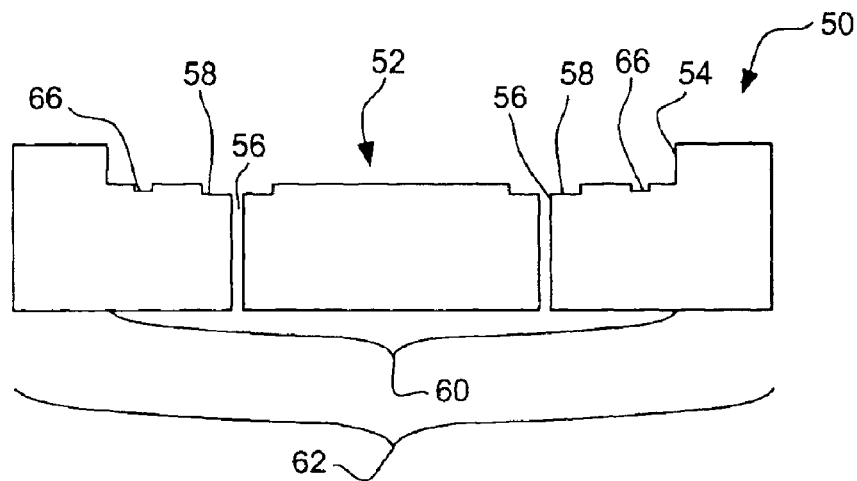
FIG. 4 is a cross sectional view of a working embodiment.

FIG. 4 is a cross sectional view of a working embodiment illustrating various features. The working embodiment holder 50 was constructed using aluminum. The holder 50 includes a pocket 52 having a depth 54 of 333 μm. Several through holes 56 are in fluid communication with several channels 58 defined in the bottom of the pocket 52. The pocket 52 has a width 60 of 3.005 inches (76.33 mm), while the holder 50 has a width 62 of 3.937 inches (100 mm). An extra circumferential groove 66 is included in the pocket 52. The groove 66 serves several purposes as noted below.

Figure 5:
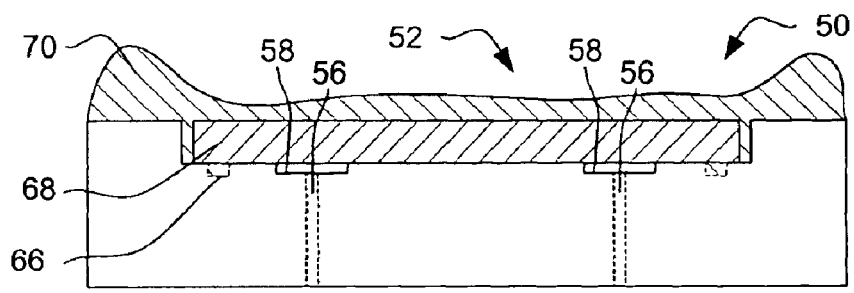
FIG. 5 is a cross sectional view of the working embodiment from FIG. 4 with a wafer inserted in the pocket and photoresist spun on the surface.

For the working embodiment, the holder 50 was used to illustrate an improved photoresist layer that is spun with a wafer in the holder 50. The result of this step is illustrated by FIG. 5, which is a cross sectional view of the working embodiment from FIG. 4 with a wafer inserted in the pocket and photoresist spun on the surface. A wafer 68 is placed in the pocket 52, and vacuum suction was applied by the spin apparatus through the through holes 56. There is a gap between the edge of the wafer 68 and the wall of the pocket 52 which allows for easier removal of the wafer 68 from the pocket 52, but which also allows some photoresist 70 to seep around the wafer 68. Then an amount of photoresist was placed on the wafer 68, and the wafer with the holder 50 was spun to spread the photoresist. It should be noted again that the figures are not necessarily to scale.

After spinning, a layer of photoresist 70 is deposited over the surface of the wafer 68 as well as the wafer holder 50. It can be seen that the edge bead of the photoresist 70 is actually over the wafer holder 50, and not the wafer 68 itself. Some of the photoresist 70 seeps beneath the wafer 68 into the groove 66. The groove 66 helps prevent any of the photoresist 70 from reaching the channel 58 and through hole 56. After a pre-bake of the photoresist 70, and before exposure, the edge bead on the photoresist 70 is cleaned off with acetone, allowing for effective use of a contact mask for lithography. After exposure, the wafer holder 50, wafer 68 and photoresist 70 are subjected to development, during which an amount of alcohol or acetone (depending on what is used) seeps into the groove 66, dissolving and removing the photoresist 70. When placed on a hot-plate, the alcohol or acetone that seeped into the groove 66 boils and evaporates, expanding greatly, and causes the wafer 68 to pop out of the pocket 52, making the step of removing the wafer 68 from the pocket 52 very simple, easy and clean.

Figure 1:
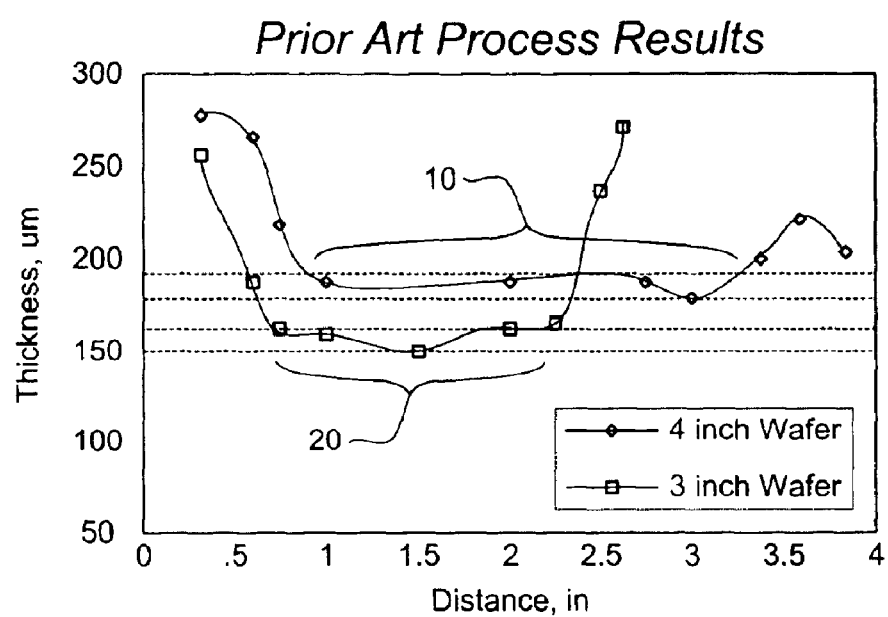
FIG. 1 is a graph representing the profile of a thick photoresist layer applied using a prior art process to different size wafers.
Figure 6:
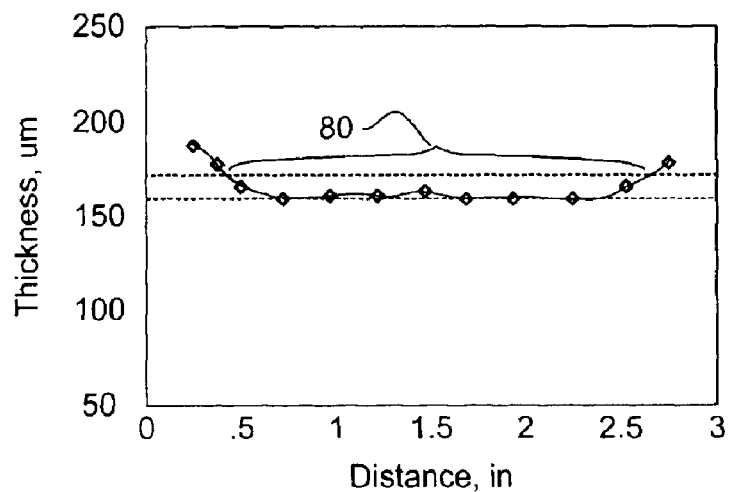
FIG. 6 is a graph representing the profile of a thick photoresist layer applied using a working embodiment of the present invention.

FIG. 6 is a graph representing the profile of a thick photoresist layer applied using a working embodiment of the present invention. Again, the dashed lines illustrate acceptable bounds for the photoresist layer. The acceptable region 80 extends over a greater area of the wafer. The result of the working embodiment is that slightly more than 2 inches of the diameter of the three inch wafer is now usable, providing a yield of about 44% of the area of the wafer, nearly double that for the three inch wafer by itself as illustrated in FIG. 1. Use of an even larger wafer holder relative to the wafer 68 may yield further improvement.

In an alternative embodiment, a wafer holding apparatus may be provided which lacks a pocket or recessed area for receiving a wafer. Instead, the wafer holding apparatus may include a number of channels and/or through holes which extend to a flat surface on which a wafer may be placed. A suction or vacuum force may then be applied using the through holes to secure the wafer in place on the holder.

Those skilled in the art will recognize that the present invention may be manifested in a variety of forms other than the specific embodiments described and contemplated herein. Accordingly, departures in form and detail may be made without departing from the scope and spirit of the present invention as described in the appended claims.

What is claimed is:

1. A method of preparing a wafer for a fabrication process, the method comprising:
   providing a wafer receiving apparatus for receiving a wafer of a first size, the wafer receiving apparatus including a recessed portion having a depth;
   placing a wafer of the first size in the recessed portion of the wafer receiving apparatus;
   applying photoresist to the wafer;
   spinning the wafer and the wafer receiving apparatus while the wafer is placed in the recessed portion of the wafer receiving apparatus; and
   wherein the wafer receiving apparatus further includes a circumferential groove in the recessed portion, wherein the method further comprises:
   allowing a fluid to enter the circumferential groove; and
   causing the fluid in the circumferential groove to expand and release the wafer from the pocket.

2. The method of claim 1 wherein the spinning step is performed such that the spinning distributes the photoresist onto both the wafer and the wafer receiving apparatus.

3. The method of claim 1 wherein the depth of the recessed portion is selected to flatten the photoresist profile on the wafer.

4. The method of claim 3 wherein the depth of the recessed portion is substantially equal to the thickness of the wafer.

5. The method of claim 1 wherein the wafer receiving apparatus further includes a channel coupled to the recessed portion, the channel adapted to allow a vacuum force to be applied within the recessed portion.

6. The method of claim 5 further comprising:
   applying a vacuum force via the channel after the wafer is placed, the vacuum force being applied such that the wafer is held in place in the recessed portion.

7. A method of reducing edge bead thickness while applying photoresist to a wafer comprising:
   providing a wafer receiving apparatus for receiving a wafer of a first size, the wafer receiving apparatus including a pocket having a depth, wherein the depth is chosen to correspond to a wafer of the first size;
   placing a wafer of the first size in the pocket of the wafer receiving apparatus;
   applying photoresist to the wafer;
   spinning the wafer and the wafer receiving apparatus while the wafer is placed in the pocket to create a photoresist layer of a desired thickness; and
   wherein the wafer receiving apparatus is sized to be compatible with machines adapted for use with wafers of a second size larger than the first size.

8. The method of claim 7 wherein the depth is greater than the thickness of the wafer.

9. The method of claim 7 wherein the depth is less than the thickness of the wafer plus the thickness of the desired photoresist layer.

10. The method of claim 7 wherein the depth is substantially equal to the thickness of the wafer.

11. The method of claim 7 wherein the first size is the size of a three inch wafer, and the second size is the size of a four inch wafer.

12. The method of claim 7 further comprising securing the wafer in the pocket.

13. The method of claim 7 wherein the wafer receiving apparatus further includes a channel coupled to the recessed portion, the channel adapted to allow a vacuum force to be applied within the recessed portion and wherein the step of securing the wafer in the pocket includes:
   applying a vacuum force via the channel after the wafer is placed, the vacuum force being applied such that the wafer is held in place in the recessed portion.

14. The method of claim 7 wherein the wafer receiving apparatus further includes a circumferential groove in the recessed portion, wherein the method further comprises:
   allowing a fluid to enter the circumferential groove; and
   causing the fluid in the circumferential groove to expand and release the wafer from the pocket.

15. A method of reducing edge bead thickness while applying photoresist to a wafer comprising:
   providing a wafer receiving apparatus for receiving a wafer of a first size, the wafer receiving apparatus including a pocket having a depth, wherein the depth is chosen to correspond to a wafer of the first size;
   placing a wafer of the first size in the pocket of the wafer receiving apparatus;

applying photoresist to the wafer;

spinning the wafer and the wafer receiving apparatus while the wafer is placed in the pocket to create a photoresist layer of a desired thickness; and wherein the depth is less than the thickness of the wafer plus the thickness of the desired photoresist layer.

16. A method of reducing edge bead thickness while applying photoresist to a wafer comprising:

providing a wafer receiving apparatus for receiving a wafer, the wafer receiving apparatus being sized to be compatible with machines adapted for use with wafers of a second size larger than wafers of a first size, the wafer receiving apparatus including a pocket having a depth, wherein the depth is chosen to correspond to a wafer of the first size;

placing a wafer of the first size in the pocket of the wafer receiving apparatus;

applying photoresist to the wafer;

spinning the wafer and the wafer receiving apparatus while the wafer is placed in the pocket to create a photoresist layer of a desired thickness; and wherein the first size is the size of a three inch wafer, and the second size is the size of a four inch wafer.

17. A method of reducing edge bead thickness while applying photoresist to a wafer comprising:

providing a wafer receiving apparatus for receiving a wafer of a first size, the wafer receiving apparatus including a pocket having a depth, wherein the depth is chosen to correspond to a wafer of the first size;

placing a wafer of the first size in the pocket of the wafer receiving apparatus;

applying photoresist to the wafer;

spinning the wafer and the wafer receiving apparatus while the wafer is placed in the pocket to create a photoresist layer of a desired thickness; and wherein the wafer receiving apparatus further includes a circumferential groove in the recessed portion, wherein the method further comprises:

allowing a fluid to enter the circumferential groove; and causing the fluid in the circumferential groove to expand and release the wafer from the pocket.

* * * * *

UNITED STATES PATENT AND TRADEMARK OFFICE
CERTIFICATE OF CORRECTION

PATENT NO. : 6,887,801 B2  
APPLICATION NO. : 10/623351  
DATED : May 3, 2005  
INVENTOR(S) : Bernard Q. Li It is certified that error appears in the above-identified patent and that said Letters Patent is hereby corrected as shown below:

Title Page,  
Page 3, column 2, line 10, change "Appl, Phys." to --Appl. Phys.--  
Page 3, column 2, line 11, change "(10-K-300K)" to --(10K-300K)--  
Page 3, column 2, line 58, change "Electo-Optics" to --Electro-Optics--  
Page 4, column 1, line 29, change "Vo. 1850," to --Vol. 1850,--  
Page 4, column 2, line 43, change "Proceedings fo" to --Proceedings of--

Column 1,  
Line 34, change "area 12" to --area 20--

Column 2,  
Line 26, before "the wafer" change "bold" to --hold--

Column 3,  
Line 10, after "drilled" change "in," to --therein,--

Signed and Sealed this

Thirty-first Day of July, 2007

JON W. DUDAS  
*Director of the United States Patent and Trademark Office*